(12) United States Patent
Bower

(10) Patent No.: US 7,631,251 B2
(45) Date of Patent: Dec. 8, 2009

(54) METHOD AND APPARATUS FOR CALCULATING CHECKSUMS

(75) Inventor: Kenneth Scott Bower, Fort Collins, CO (US)

(73) Assignee: Hewlett-Packard Development Company, L.P., Houston, TX (US)

(*) Notice: Subject to any disclaimer, the term of this patent is extended or adjusted under 35 U.S.C. 154(b) by 620 days.

(21) Appl. No.: 11/059,193

(22) Filed: Feb. 16, 2005

(65) Prior Publication Data

US 2006/0195759 A1    Aug. 31, 2006

(51) Int. Cl.
*H03M 13/00* (2006.01)
(52) U.S. Cl. .................................. 714/807; 714/758
(58) Field of Classification Search ........... 714/807, 714/758
See application file for complete search history.

(56) References Cited

U.S. PATENT DOCUMENTS

| 4,712,214 | A  | * | 12/1987 | Meltzer et al. ............ 714/748 |
| 5,500,864 | A  | * | 3/1996  | Gonia et al. ............... 714/807 |
| 5,724,370 | A  | * | 3/1998  | Sferrazza et al. .......... 714/807 |
| 6,938,198 | B1 | * | 8/2005  | Purcell ..................... 714/758 |
| 6,964,008 | B1 | * | 11/2005 | Van Meter, III ........... 714/807 |
| 7,185,266 | B2 | * | 2/2007  | Blightman et al. ........ 714/776 |

* cited by examiner

*Primary Examiner*—Scott T Baderman
*Assistant Examiner*—Enam Ahmed

(57) ABSTRACT

A method for calculating checksums includes calculating a first checksum based at least in part on a first block of data, and calculating a partial checksum based at least in part on a second block of data. The second block of data comprises a data portion followed by a fill portion, the fill portion having a length equal to a length of the first block of data. The first checksum and partial checksum are combined to form a second checksum for a total block of data, the total block of data comprising the first block of data and the data portion of the second block of data.

8 Claims, 2 Drawing Sheets

METHOD AND APPARATUS FOR CALCULATING CHECKSUMS

An appendix containing Verilog code implementing one exemplary embodiment of the method and apparatus for calculating checksums is submitted on two duplicate compact discs and is incorporated herein by reference. The Verilog code on the appendix compact discs includes eleven files, all of which were created in this form on Jan. 27, 2005, a main file entitled verilog.txt (8,859 bytes) and ten files containing subroutines entitled func_fd16.txt, (2,485 bytes), func_fd32.txt, (4,844 bytes), func_fdz32.txt, (5,218 bytes), func_fdz64.txt, (5,395 bytes), func_fdz96.txt, (5,901 bytes), func_fz16.txt, (2,774 bytes), func_fz32.txt, (4,847 bytes), func_fz64.txt, (5,189 bytes), func_fz96.txt, (5,365 bytes), and func_fz128.txt (5,883 bytes).

BACKGROUND

The rapid and accurate transmission of data has become increasingly important as computer use has become widespread. Error detection and correction schemes are commonly used to ensure that data is accessed and transmitted without errors, both within a computer system and across networks such as a local area network (LAN) or the Internet. In one such error detection scheme, a checksum is calculated for a block of data and is transmitted along with that block of data. The receiver may then recalculate the checksum for the block of data and compare it with the originally calculated and transmitted checksum. Any differences between the two checksums indicate an error in the transmitted block of data (or in the transmitted checksum). Many different types of checksums are commonly used, and many techniques are known for calculating various types of checksums. For example, one type of checksum is a cyclic redundancy check (CRC), which may be calculated in one exemplary algorithm by dividing the number in the block of data by a constant number and using the remainder as the checksum. The division may be performed, for example, using binary arithmetic modulo 2 with no carries.

Some data handling systems include multiple layers of data packaging and error checking, in which multiple checksums are calculated for various combinations of a block of data, header information and checksums. For example, the PCI Express system includes multiple layers such as a data link layer and a transaction layer. At the transaction layer, a block of data is accompanied by an end-to-end checksum based on the block of data. At the data link layer, the block of data may be accompanied by the end-to-end checksum, other information such as a sequence number to ensure that multiple blocks of data are in order, and a link checksum based on the block of data, the sequence number, the end-to-end checksum, etc. The electronic circuits or computer executable code for calculating these CRC checksums, particularly when multiple checksums must be calculated for multiple layers, quickly become relatively large as the number of checksums to calculate grows. The size of the electronic circuits or computer executable code may be further multiplied if the data handling system supports multiple data block lengths.

SUMMARY

An exemplary embodiment may comprise a method for calculating checksums, the method including calculating a first checksum based at least in part on a first block of data, and calculating a partial checksum based at least in part on a second block of data. The second block of data comprises a data portion followed by a fill portion, the fill portion having a length equal to the length of the first block of data. The method also includes combining the first checksum and the partial checksum to form a second checksum for a total block of data, the total block of data comprising the first block of data and the data portion of the second block of data.

Another exemplary embodiment may comprise an apparatus for calculating checksums, comprising at least one computer readable medium, with computer readable program code stored on the at least one computer readable medium. The computer readable program code includes code for calculating a first checksum for a block of data, and code for calculating a second checksum based on a second block of data and on the first checksum. The first block of data comprises a data portion followed by a fill portion, the fill portion and the second block of data having an equal length.

Another exemplary embodiment may comprise means for calculating an end-to-end cyclic redundancy checksum for a first block of data, and means for calculating a link cyclic redundancy checksum for a second block of data, wherein the second block of data differs from the first block of data by at least a prepended sequence number present in the second block of data and absent from the first block of data. The means for calculating the link cyclic redundancy checksum bases the link cyclic redundancy checksum at least partially on the end-to-end cyclic redundancy checksum rather than on a common portion of the first and second blocks of data.

BRIEF DESCRIPTION OF THE DRAWINGS

Illustrative embodiments are shown in the accompanying drawings as described below.

DESCRIPTION

Figure 1:
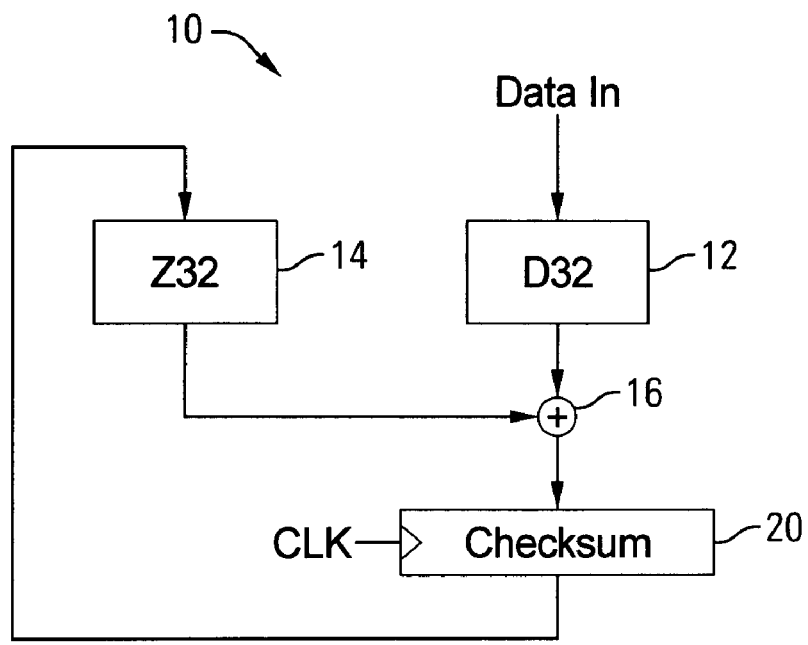
FIG. 1 is a block diagram of an exemplary circuit for calculating a checksum on a message.

The drawing and description, in general, disclose a method and apparatus for calculating multiple checksums for two blocks of data which differ by a prepended number sequence. The method and apparatus for calculating checksums is reduced in size and is potentially made faster by computing one of the checksums and the difference between the checksums, then using that difference and the calculated checksum to arrive at the final checksum. By calculating the difference between the checksums, the method and apparatus for calculating checksums can calculate the checksum on the common portion of the two blocks of data just once, unlike the conventional approach of individually calculating the checksum for each of the two blocks of data.

The method and apparatus for calculating multiple checksums may be used in any data handling system in which multiple checksums are calculated for multiple blocks of data having at least one portion in common. In other words, if the blocks of data share the same value in at least one area, the method and apparatus for calculating multiple checksums disclosed herein may be used, thereby reducing the overall size of the circuit. The method and apparatus for calculating multiple checksums may be adapted to data having any format and any arrangement of common portions and differences between data blocks. In one exemplary embodiment, the common portion of two data blocks may be transmitted at a rate of either 32, 64, 96 or 128 bits per clock cycle. The two data blocks differ in that one of the two data blocks has an additional header portion prepended to the beginning of the data block before the common data, such as a PCI Express sequence number preceding the message data. However, the method and apparatus for calculating multiple checksums is not limited to this exemplary arrangement or application. The exemplary prepended portion is referred to at times herein as a prepended sequence or sequence number. The common portion of the data blocks is referred to at times herein as a data word or message. The exemplary sequence has a length of 16 bits, which may carry any type of information, or empty filler bits, or a combination of the two. The exemplary message may have any length, may be transmitted at a rate of either 32, 64, 96 or 128 bits per clock cycle, and may also contain any values, whether information or empty filler. The checksums to be calculated include a checksum on the message (which may correspond to an end-to-end checksum in a PCI Express system) and a checksum on the prepended sequence followed by the message (which may correspond to one type of link checksum in a PCI Express system).

The method and apparatus for calculating multiple checksums may be implemented in any suitable manner, such as in an electronic circuit or in software executed by a general purpose computer processor, for example. In one exemplary embodiment described in detail herein, the method and apparatus for calculating multiple checksums is implemented in a programmable gate array using code written in the Verilog hardware description language.

A block diagram of an exemplary circuit 10 to calculate the checksum for the message is illustrated in FIG. 1. The circuit 10 is capable of computing a checksum on 32 bits of data per clock cycle. The message is fed to the circuit 10 at the rate of 32 bits per clock cycle until the entire message has been processed by the circuit 10. The input data of the message is passed through an exclusive-or (XOR) tree D32 12 as it enters the circuit 10. The XOR tree D32 12, and another XOR tree Z32 14 in the circuit 10, combine various input bits in XOR operations according to predetermined CRC polynomials, as is well known, to generate their output. The D32 12 portion of the XOR trees in the circuit 10 operates on incoming data bits, and the Z32 14 portion of the XOR trees in the circuit 10 operates on the previously calculated checksum. The result from the XOR tree D32 12 is combined with the output of the XOR tree Z32 14 in an XOR element 16 and is stored in the checksum register 20. If the message contains more than 32 bits, the next 32 bits of message are passed through XOR tree D32 12 on the next clock cycle as the contents of the checksum register 20 are passed through XOR tree Z32 14. The new results of XOR tree D32 12 and XOR tree Z32 14 are combined in the XOR element 16 and stored in the checksum register 20. This process continues until all bits of the message have been processed, and the checksum register 20 contains the CRC checksum for the message. Note that the checksum register 20 may be initialized with some value at the beginning of the checksum calculation, such as all ones, so that XOR tree Z32 14 has some affect the first time its output is combined with the output of XOR tree D32 12.

As discussed above, the algorithms applied by the XOR trees D32 12 and Z32 14 in the circuit 10 may be adjusted as desired according to the selected checksum scheme. For example, in a CRC checksum scheme, any of a number of polynomials may be selected as is well known.

According to conventional technology, the checksum for the message with the prepended sequence may be calculated in another circuit similar to circuit 10 in FIG. 1, doubling the size of the overall circuitry needed to calculate the checksums. However, because the circuit 10 is tailored to the length of the incoming data, if the length of the prepended sequence is not equal to that of the message, additional circuitry would be added to calculate the checksum on the prepended sequence, more than doubling the size of the overall circuitry.

The method and apparatus for calculating multiple checksums minimizes the size of the overall circuitry by calculating an intermediate or partial checksum on the difference between the message and the message with the prepended sequence. The intermediate checksum may then be combined with the checksum of the message to arrive at the checksum of the message plus the prepended sequence. This is possible because of the cumulative properties of the XOR operation. Specifically, the checksum of the message plus the prepended sequence may be calculated by combining (in an XOR operation) the checksum of the prepended sequence followed by a number of fill zeros equal to the length of the message with the checksum of the message prepended with a number of fill zeros equal to the length of the prepended sequence. By adding several XOR elements with constants to apply and back out the affects of an initial value in the checksum register, the two checksums may be calculated using a circuit that is smaller than two separate copies of circuit 10 of FIG. 1.

Figure 2:
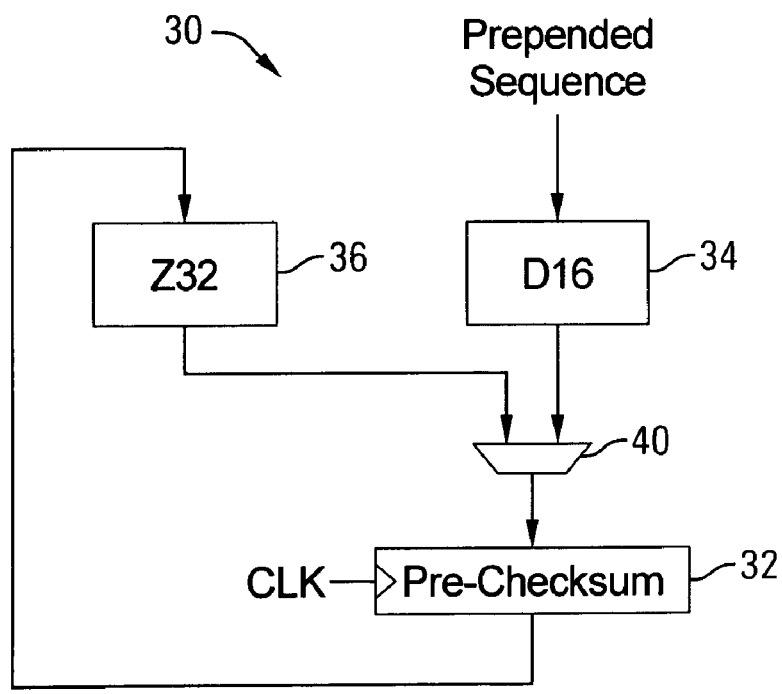
FIG. 2 is a block diagram of an exemplary circuit for calculating a checksum on a prepended sequence.

An exemplary circuit 30 to calculate the intermediate checksum is illustrated in FIG. 2. In this circuit 30, the intermediate checksum register 32 (or pre-checksum register) may be loaded at each clock cycle with either the output of XOR tree D16 34 or XOR tree Z32 36. The XOR tree D16 34 performs the initial checksum calculation function on the incoming prepended sequence, and the result is stored in the intermediate checksum register 32. Thereafter, for each subsequent clock cycle in which additional message data is fed to circuit 10, the results of the intermediate checksum register 32 are processed by the XOR tree Z32 36 and stored in the intermediate checksum register 32.

This recursive processing of the prepended sequence by XOR tree Z32 36 mirrors the processing of the checksum on the message in circuit 10 by the XOR tree Z32 14, that is, the prepended sequence is processed by the XOR tree Z32 36 the same number of times that the message passes through the XOR tree Z32 14. This is equivalent to computing the checksum of the prepended sequence followed by zeros to the length of the message. Because zeros do not change the result of an XOR operation, the recursive processing of the prepended sequence by XOR tree Z32 described above has the same affect as if the output of XOR tree D16 34 were being combined with the output of XOR tree Z32 36 in an XOR operation each clock cycle as in circuit 10, with all zeros feeding into the input of XOR tree D16 34. Because XOR tree D16 34 simply combines various input bits in XOR operations to form the output bits, the output of XOR tree D16 34 would be all zeros each time, and would therefore have no effect on any XOR operation with the output of XOR tree Z32 36. Therefore, the outputs of XOR tree D16 34 need not be combined with the output of XOR tree Z32 36 in an XOR operation in circuit 30 as in circuit 10 to account for appending zeros to the prepended sequence, as long as the prepended sequence is recursively processed by the XOR tree Z32 36 in circuit 30 the same number of times that the message passes through the XOR tree Z32 14 in circuit 10.

Note that the XOR trees Z32 14 and Z32 36 in the two checksum circuits 10 and 30, respectively, are equivalent in the exemplary embodiment. Because the sequence number in the exemplary embodiment is only 16 bits long, the sequence number is zero-padded to 32 bits as it enters the circuit 30 so it may be correctly processed by the XOR tree Z32 36. As shown in more detail in the Verilog code of the appendix compact disc, the exemplary XOR tree D16 34 is adapted to a 32 bit word to match the word length of circuit 10. However, the size of the XOR tree D16 34 is not increased by this adaptation, because the exemplary sequence number remains 16 bits long, and zero padding the input affects only the output arrangement of XOR tree D16 34 without increasing the number of XOR gates used.

Figure 3:
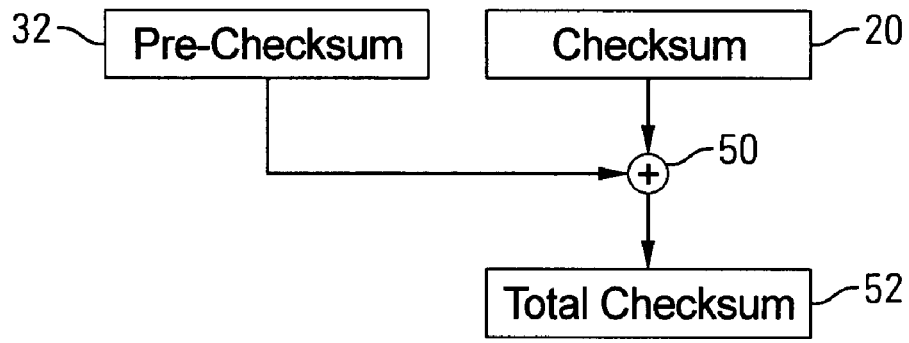
FIG. 3. is a block diagram of an exemplary circuit for combining the results of the circuits of FIGS. 1 and 2 to obtain a checksum on the aggregate of the prepended sequence of FIG. 2 followed by the message of FIG. 1.

By combining the checksum (stored in the checksum register 20 from circuit 10) and the intermediate checksum (stored in the pre-checksum register 32 from circuit 30) in an XOR operation 50 as illustrated in FIG. 3, the checksum 52 of the message plus the prepended sequence is obtained.

On the surface, using circuits 10 and 30 to calculate the checksums of the message and of the prepended sequence, then combining them to obtain the checksum of the prepended sequence plus the message may appear very similar to simply duplicating circuit 10 to calculate the two desired checksums 20 and 52. However, the XOR tree D16 34 has fewer inputs, a smaller fan-in and fewer gates. Therefore, circuit 20 is smaller than circuit 10. Furthermore, because the length of the prepended sequence in the exemplary embodiment stays at a constant length even if the input word length of the message is increased, the XOR tree D16 34 in circuit 30 is not scaled up like the XOR tree D32 12 in circuit 10. For example, if the message is transmitted at 128 bits per clock cycle, circuit 10 is adapted by replacing XOR tree D32 12 and XOR tree Z32 14 with D128 and Z128 XOR trees. The D128 XOR tree would have a maximum fan-in of 128 bits, although depending on the CRC polynomial, it would likely be around 64 bits. The fan-in of the Z128 XOR tree is dependent on the width of the checksum being calculated, which is 32 bits in the exemplary embodiment, so the Z128 XOR tree would still only have a maximum fan-in of 32 bits and would be no more complex that the Z32 XOR tree 14. Circuit 30 would be unchanged by the change to a 128 bits per clock cycle transmission rate. In this exemplary embodiment, the savings over simply duplicating circuit 10 is the difference in size between a D128 XOR tree and a D16 XOR tree. This savings is substantial because the D128 XOR tree in a duplicated circuit 10 would dominate the size of circuit 10 and would be over five times as complex as the D16 XOR tree in circuit 30. This savings is magnified if, as in the exemplary Verilog code, the overall circuit for calculating checksums is adapted to receive message data at 32, 64, 96 or 128 bits per clock cycle. In this case, circuit 10 includes a D32 XOR tree, a D64 XOR tree, a D96 XOR tree and a D128 XOR tree, while circuit 30 has just one D16 XOR tree.

Figure 4:
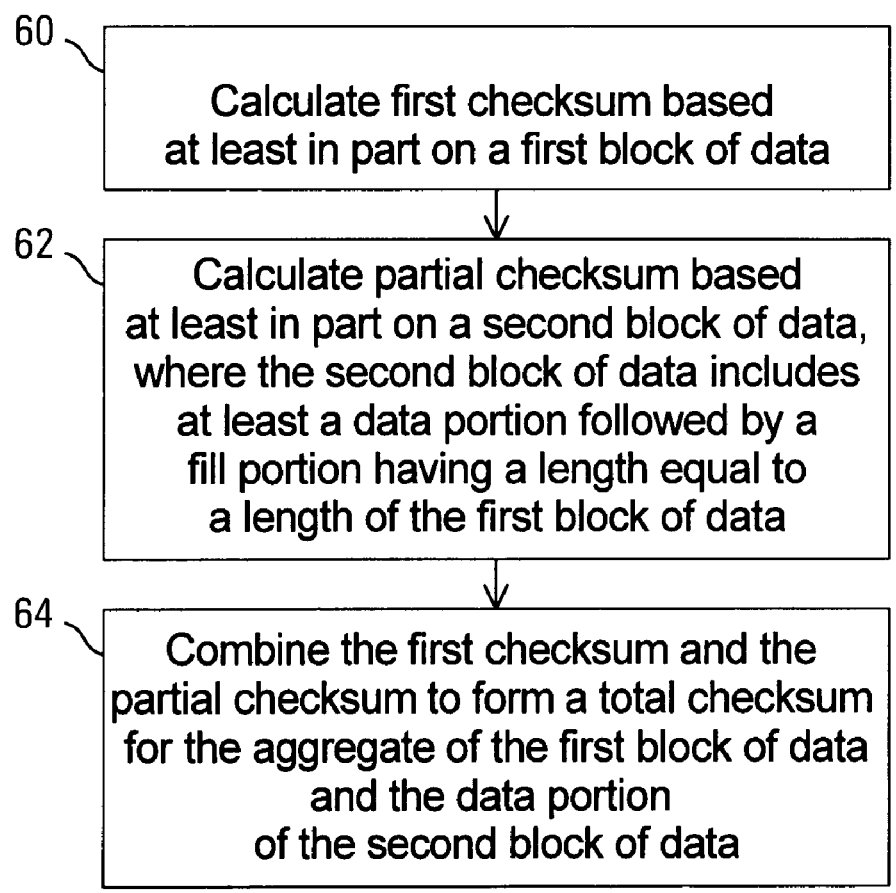
FIG. 4 is a flow chart of an exemplary operation for calculating multiple checksums.

An exemplary operation for calculating checksums is summarized in the flowchart of FIG. 4. A first checksum is calculated 60 based at least in part on a first block of data such as the message. A partial checksum is calculated 62 based at least in part on a second block of data. The second block of data includes at least a data portion followed by a fill portion having a length equal to a length of the first block of data. For example, in one exemplary embodiment, the second block of data is the aggregate of the prepended sequence followed by a number of zeros equal to the length of the message. If the message has a length of 1024 bits, and the prepended sequence has a length of 16 bits, the second block of data would be the 16 bits of the prepended sequence followed by 1024 zeros, for a total length of 1040 bits. The first checksum and the partial checksum are combined 64 to form a second checksum or total checksum for the total block of data made up of the aggregate of the first block of data and the data portion of the second block of data.

As mentioned above, one exemplary embodiment of the method and apparatus for calculating multiple checksums comprises Verilog code defining the circuits for calculating the checksums, as contained in the appendix on compact disc. The Verilog code may be used in any suitable manner, such as in a programmable gate array (PGA) or to design an application specific IC (ASIC). Some of the variables and registers used in the exemplary Verilog code will now be described. The exemplary Verilog code is used to calculate an end-to-end checksum and a link checksum, based on a message and a prepended sequence. The message is received by the 128 bit "data_in" input. The message may be received at a rate of either 32, 64, 96 or 128 bits per clock cycle. A 2 bit "word_count_in" input is used to select the message data rate. The prepended sequence is received by the 16 bit "seq_in" input. Various control inputs including the "data_valid_in", "header_in" and "last_data" inputs are used to indicate the status of the data and to identify the arrival of the prepended sequence and the end of the message.

The resulting end-to-end checksum is provided at the 32 bit "ecrc_out" output and the link checksum is provided at the 32 bit "lcrc_out" output. The "ecrc_valid" and "lcrc_valid" outputs indicate that the checksums have been calculated and are available. The partial checksum based on the prepended sequence and used in the calculation of the link checksum is also made available at the 32 bit "crc_diff" output.

As discussed above, the partial checksum "crc_diff" is calculated by repeatedly passing the prepended sequence through the XOR tree Z32 36 using the fz32 function for as long as the message is being processed. (If the message is received at a rate other than 32 bits per clock cycle, the fz64, fz96 or fz128 functions are used.) The end-to-end checksum "ecrc_out" based on the message is calculated by passing the message through the D32 and Z32 XOR trees 12 and 14 using the fd32 and fz32 functions, respectively, if the message is received 32 bits per clock cycle, and using other functions such as the fdz64 and fz64 at other rates.)

The exemplary link checksum "lcrc_out" may be provided in one of two formats based on the state of the "compute_e-crc" input. In either case, the "ecrc_out" checksum is combined with the "crc_diff" partial checksum to form the link checksum "lcrc_out". The actual formulas or methods used to combine the "ecrc_out" checksum with the "crc_diff" partial checksum is not critical, and the final combination may be adapted to the type of checksum desired. For example, it can be a simple XOR operation, or it can apply further CRC polynomials. The method and apparatus for calculating multiple checksums efficiently calculates the partial checksum of the difference between the message alone and the message plus the prepended sequence, which can be combined with the checksum of the message alone to form the total checksum. The exemplary forms of the total checksum "lcrc_out" set forth in the Verilog code may be adapted as desired to the incoming data and the required checksums. For example, the incoming data may contain additional fields such as other checksums or other header-type information that affect the formation of the total checksum. The required format of the total checksum also affects the method in which "crc_diff" and "ecrc_out" are combined. For example, the byte-order of the total checksum may be adjusted during the combination of the "crc_diff" and "ecrc_out" checksums.

As mentioned above, the exemplary embodiment of the method and apparatus for calculating multiple checksums includes several XOR elements with constants to apply and back out the affects of an initial value in the end-to-end checksum register 20. This is done because the initial value of the end-to-end checksum register 20 is set to all ones, so that the XOR operation on the end-to-end checksum register 20 in the Z32 XOR tree 14 has some affect the first time through the circuit 10. (The exemplary Verilog code for performing this initialization is in the line "feedback=32'hffffffff;"). Similarly, the initial value of the partial checksum register 32 is also set to all ones. (The exemplary Verilog code for performing this initialization is in the line "next_crc_seq16=fd16 ({16'b0,seq_in}) ^ fz16(32'hffffffff);"). In order to back out the initialization for the end-to-end checksum calculation, the end-to-end checksum initial value is inserted into the partial checksum calculation using an XOR operation at the same point in the number sequence. Because the end-to-end checksum is calculated on the message, which begins at the end of the prepended sequence, the initial value of the end-to-end checksum register 20 is inserted into the total checksum calculation (via the partial checksum calculation) midway, at the beginning of the message in the number sequence, rather than at the beginning of the total number sequence consisting of the prepended sequence and the message. Therefore, to back this end-to-end checksum register 20 initial value out of the partial checksum calculation at the proper point in the number sequence, this initial value is inserted into the partial checksum calculation using an XOR operation with the intermediate value of the partial checksum after the first 16 bits (the prepended sequence) have been processed in circuit 30. (The exemplary Verilog code for this is in the line "diff_feedback=~crc_seq16;"). Note that the exemplary Verilog code is able to perform the equivalent of the XOR operation using a bitwise inversion, because the initial value of the end-to-end checksum register 20 is all ones, and (A XOR 1)=~A. The equivalent exemplary Verilog code for this line is "diff_feedback=crc_seq16 ^ 32'hffffffff". The choice of which method to use may be influenced by the efficiency of the resulting circuit produced by the Verilog code. The insertion of the end-to-end checksum register 20 initial value in the partial checksum calculation at the proper point in the number sequence has the effect of negating the initialization for the end-to-end checksum calculation because of the mathematical property that (A XOR B XOR B)=A. In this case the actual XOR operation that negates the impact of the initialization does not occur until the partial checksum is combined with the end-to-end checksum in an XOR operation to form the total checksum, taking advantage of the cumulative property of modulo addition.

Various computer readable or executable code or electronically executable instructions have been referred to herein. These may be implemented in any suitable manner, such as software, firmware, hard-wired electronic circuits, or as the programming in a gate array, etc. Software may be programmed in any programming language, such as machine language, assembly language, or high-level languages such as C or C++ or in hardware description languages such as Verilog. The computer programs may be interpreted or compiled or otherwise used to develop electronic circuits.

Computer readable or executable code or electronically executable instructions may be tangibly embodied on any computer-readable storage medium or in any electronic circuitry for use by or in connection with any instruction-executing device, such as a general purpose processor, software emulator, application-specific circuit, a circuit made of logic gates, etc. that can access or embody, and execute, the code or instructions.

Methods described and claimed herein may be performed by the execution of computer readable or executable code or electronically executable instructions, tangibly embodied on any computer-readable storage medium or in any electronic circuitry as described above.

A storage medium for tangibly embodying computer readable or executable code or electronically executable instructions includes any means that can store, transmit, communicate, or in any way propagate the code or instructions for use by or in connection with the instruction-executing device. For example, the storage medium may include (but is not limited to) any electronic, magnetic, optical, or other storage device, or any transmission medium such as an electrical conductor, an electromagnetic, optical, infrared transmission, etc. The storage medium may even comprise an electronic circuit, with the code or instructions represented by the design of the electronic circuit. Specific examples include magnetic or optical disks, both fixed and removable, semiconductor memory devices such as memory cards and read-only memories (ROMs), including programmable and erasable ROMs, non-volatile memories (NVMs), optical fibers, etc. Storage media for tangibly embodying code or instructions also include printed media such as computer printouts on paper which may be optically scanned to retrieve the code or instructions, which may in turn be parsed, compiled, assembled, stored and executed by an instruction-executing device. The code or instructions may also be tangibly embodied as an electrical signal in a transmission medium such as the Internet or other types of networks, both wired and wireless.

While illustrative embodiments have been described in detail herein, it is to be understood that the concepts disclosed herein may be otherwise variously embodied and employed, and that the appended claims are intended to be construed to include such variations, except as limited by the prior art.

What is claimed is:

1. A method of calculating checksums, comprising:
   calculating a first checksum based at least in part on a first block of data;
   calculating a partial checksum based at least in part on a second block of data, wherein said second block of data comprises a data portion followed by a fill portion, said fill portion having a length equal to a length of said first block of data; and
   combining at least said first checksum and said partial checksum to form a second checksum for a total block of data, said total block of data comprising said first block of data and said data portion of said second block of data.

2. The method of claim 1, wherein said fill portion contains all zero values.

3. The method of claim 1, wherein said combining comprises an Exclusive OR operation on at least said first checksum and said partial checksum.

4. The method of claim 1, wherein said data portion of said second block of data precedes said first block of data in said total block of data.

5. The method of claim 1, wherein said data portion of said second block of data and said first block of data are contiguous in said total block of data.

6. The method of claim 1, wherein said first checksum comprises an end-to-end cyclic in redundancy checksum and said second checksum comprises a link cyclic redundancy checksum.

7. An apparatus for calculating checksums, comprising
   means for calculating an end-to-end cyclic redundancy checksum for a first block of data; and
   means for calculating a link cyclic redundancy checksum for a second block of data, wherein said second block of data differs from said first block of data by at least a prepended sequence number present in said second block of data and absent from said first block of data, and wherein said means for calculating said link cyclic redundancy checksum bases said link cyclic redundancy checksum at least partially on said end-to-end cyclic redundancy checksum rather than on a common portion of said first and second blocks of data.

8. The apparatus of claim 7, further comprising means for negating an initialization value for said end-to-end cyclic redundancy checksum in said means for calculating said link cyclic redundancy checksum.

* * * * *

UNITED STATES PATENT AND TRADEMARK OFFICE
CERTIFICATE OF CORRECTION

| | | |
|---|---|---|
| PATENT NO. | : 7,631,251 B2 | Page 1 of 1 |
| APPLICATION NO. | : 11/059193 | |
| DATED | : December 8, 2009 | |
| INVENTOR(S) | : Kenneth Scott Bower | |

It is certified that error appears in the above-identified patent and that said Letters Patent is hereby corrected as shown below:

In the Claims:

In column 8, line 42, in Claim 6, after "cyclic" delete "in".

In column 8, line 45, in Claim 7, after "comprising" insert -- : --.

Signed and Sealed this

Nineteenth Day of October, 2010

David J. Kappos
*Director of the United States Patent and Trademark Office*